United States Patent [19]

Vries et al.

[11] 4,354,269

[45] Oct. 12, 1982

[54] APPARATUS FOR THE PROCESSING OF AN INFORMATION STREAM WITH THE AID OF AN ERROR-CORRECTING CONVOLUTIONAL CODE AND APPARATUS FOR THE DETECTION OF AN ERROR STILL IRREMEDIABLE IN THIS PROCESSING

[75] Inventors: Lodewijk B. Vries; Matthijs A. Diepeveen, both of Eindhoven, Netherlands

[73] Assignee: U.S. Philips Corporation, New York, N.Y.

[21] Appl. No.: 185,050

[22] Filed: Sep. 8, 1980

[30] Foreign Application Priority Data

Sep. 26, 1979 [NL] Netherlands .................... 7907141

[51] Int. Cl.³ .............................................. G06F 11/10
[52] U.S. Cl. .......................................... 371/43; 371/45
[58] Field of Search ................................. 371/43, 44, 45

[56] References Cited

U.S. PATENT DOCUMENTS

| | | | |
|---|---|---|---|
| 3,402,393 | 9/1968 | Massey | 371/43 |
| 3,508,197 | 4/1970 | Tong | 371/45 |
| 3,588,819 | 6/1971 | Tong | 371/45 |
| 3,593,282 | 7/1971 | Tong | 371/44 |
| 3,697,947 | 10/1972 | Macy | 371/45 |
| 4,291,406 | 9/1981 | Bahl et al. | 371/45 |

Primary Examiner—Charles E. Atkinson
Attorney, Agent, or Firm—James J. Cannon, Jr.

[57] ABSTRACT

A sequence of k-tuples of information elements is converted by means of an error-correcting convolutional code into a sequence of n-tuples (n greater than k) of code elements. In the processing of the code elements use is made of first of all a syndrome former to form a sequence of (n−k)-tuples of syndrome elements from the n-received sequence of n-tuples of code elements. From a segment of a number of successive (n−k)-tuples of syndrome elements one or more correction bits are formed in each case so as to be able to correct the received code bits and also, if a correction is applied, to be able to update a number of further syndrome bits from that same segment. Furthermore an (n−k)-tuple of secondary syndrome bits or residue bits is formed in each case from this updated segment. A first value of such an (n−k)-tuple indicates the state in which the decoder must be provisionally considered as having corrected all errors in a predetermined sequence of n-tuples of code elements. Any other values indicate that an error has remained uncorrected. Such other values are converted into unreliability signals. The unreliability signal indicates a sub-sequence of n-tuples of code elements, in which the errors not corrected are located. Outside this sub-sequence the n-tuples can be reliable again.

6 Claims, 16 Drawing Figures

| nr | 0 | 1 | 2 | 3 | 4 | 5 | 6 | 7 | si |
|---|---|---|---|---|---|---|---|---|---|
| 1 | $d_1$ | 1 | 0 | 1 | 1 | 1 | 0 | 0 | 0 |
| 2 | $d_1$ | 0 | 0 | 1 | 1 | 1 | 0 | 0 | 0 |
| 3 | $d_1$ | 1 | 1 | 1 | 1 | 1 | 0 | 0 | 0 |
| 4 | $d_1$ | 1 | 0 | 0 | 1 | 1 | 0 | 0 | 0 |
| 5 | $d_1$ | 1 | 0 | 1 | 0 | 1 | 0 | 0 | 0 |
| 6 | $d_1$ | 1 | 0 | 1 | 1 | 0 | 0 | 0 | 0 |
| 7 | $d_1$ | 1 | 0 | 1 | 1 | 1 | 1 | 0 | 0 |
| 8 | $d_1$ | 1 | 0 | 1 | 1 | 1 | 0 | 1 | 0 |
| 8a | $d_1$ | 1 | 0 | 1 | 1 | 1 | 0 | 0 | 1 |
| 9 | $d_1$ | $d_2$ | 1 | 1 | 0 | 0 | 1 | 0 | 0 |
| 10 | $d_1$ | 1 | $d_2$ | 0 | 1 | 0 | 1 | 1 | 0 |
| 11 | $d_1$ | 1 | 0 | $d_2$ | 0 | 1 | 1 | 1 | 1 |
| 12 | $d_1$ | 1 | 0 | 1 | $d_2$ | 0 | 0 | 1 | 1 |
| 13 | $d_1$ | 1 | 0 | 1 | 1 | $d_2$ | 1 | 0 | 1 |
| 14 | $d_1$ | 1 | 0 | 1 | 1 | 1 | $d_2$ | 1 | 0 |
| 15 | $d_1$ | 1 | 0 | 1 | 1 | 1 | 0 | $d_2$ | 1 |
| 15a | $d_1$ | 1 | 0 | 1 | 1 | 1 | 0 | 0 | $d_2$ |

FIG.6

| nr | 0 | 1 | 2 | 3 | 4 | 5 | 6 | 7 | si |
|---|---|---|---|---|---|---|---|---|---|
| 16 | 1 | 0 | 0 | 0 | 0 | 0 | 0 | 0 | 0 |
| 17 | 1 | 1 | 0 | 0 | 0 | 0 | 0 | 0 | 0 |
| 18 | 1 | 0 | 1 | 0 | 0 | 0 | 0 | 0 | 0 |
| 19 | 1 | 0 | 0 | 1 | 0 | 0 | 0 | 0 | 0 |
| 20 | 1 | 0 | 0 | 0 | 1 | 0 | 0 | 0 | 0 |
| 21 | 1 | 0 | 0 | 0 | 0 | 1 | 0 | 0 | 0 |
| 22 | 1 | 0 | 0 | 0 | 0 | 0 | 1 | 0 | 0 |
| 23 | 1 | 0 | 0 | 0 | 0 | 0 | 0 | 1 | 0 |
| 23a | 1 | 0 | 0 | 0 | 0 | 0 | 0 | 0 | 1 |
| 24 | 1 | $d_3$ | 1 | 0 | 1 | 1 | 1 | 0 | 0 |
| 25 | 1 | 0 | $d_3$ | 1 | 0 | 1 | 1 | 1 | 0 |
| 26 | 1 | 0 | 0 | $d_3$ | 1 | 0 | 1 | 1 | 1 |
| 27 | 1 | 0 | 0 | 0 | $d_3$ | 1 | 0 | 1 | 1 |
| 28 | 1 | 0 | 0 | 0 | 0 | $d_3$ | 1 | 0 | 1 |
| 29 | 1 | 0 | 0 | 0 | 0 | 0 | $d_3$ | 1 | 0 |
| 30 | 1 | 0 | 0 | 0 | 0 | 0 | 0 | $d_3$ | 1 |
| 30a | 1 | 0 | 0 | 0 | 0 | 0 | 0 | 0 | $d_3$ |

FIG.7

APPARATUS FOR THE PROCESSING OF AN INFORMATION STREAM WITH THE AID OF AN ERROR-CORRECTING CONVOLUTIONAL CODE AND APPARATUS FOR THE DETECTION OF AN ERROR STILL IRREMEDIABLE IN THIS PROCESSING

BACKGROUND OF THE INVENTION

In general the invention relates to the surveillance of the reliability of a stream of information bits with the aid of convolutional codes. The standard work in the field is the book by W. W. Peterson et al., "Error correcting codes", MIT, Boston, Mass., 2nd edition 1971, for example page 393. More particularly the invention relates to a system in which an (n, k, p) linear convolutional code is used. Random errors and also in particular circumstances accumulations of errors (bursts) can be corrected with this system.

In an encoding apparatus operating according to this code the incoming stream of information bits is divided into a sequence of groups of k bits, the so-called k-tuples $x(j)$, $x(j+1)$, $x(j+2)$, .... Simple examples are $k=1$ and $k=2$. From the stream of k-tuples of information elements a sequence corresponding thereto of n-tuples of code elements $y(j)$, $j(j+1)$, $y(j+2)$ ... is then formed, where n is always greater than k. For $n=2$ and $k=1$ the efficiency or "rate" of the code is $\frac{1}{2}$, for $n=3$ and $k=2$ the efficiency is $\frac{2}{3}$. The preferred versions to be described hereinafter give $n-k=2$. An example of a convolutional code having $(n-k)=2$ has been described in the Netherlands Patent Application No. 7804673 U.S. Ser. No. 33,718, filed Apr. 27, 1979, now abandoned, but continued as U.S. Ser. No. 257,061, filed Apr. 24, 1981, to the same assignee which has been incorporated herein by reference. Moreover in general an n-tuple of code elements is formed on the basis of more than one k-tuple of information elements. A convolutional code is said to be systematic if the information bits of the k-tuples form unchanged part of the code bits of the n-tuples; in that case the coding process comprises nothing more than the addition of a sequence of $(n-k)$-tuples composed of parity bits. The invention is not however confined to the use of such systematic convolutional codes. The parameter p is the encoding constraint length. The value of the parameter p is defined in such a way that for the formation of one $(n-k)$-tuple of parity bits a sequence of $(p+1)$ successive k-tuples of information bits is necessary, in the case of a systematic code. In the case of a non-systematic code these $(p+1)$ successive k-tuples of information bits are necessary for the formation of one n-tuple of code elements. In a corresponding manner a decoding constraint length u ($u \geq p$) has been defined: a sequence of $(u+1)$ successive $(n-k)$-tuples of parity bits, or n-tuples of code bits respectively, is necessary and sufficient for the reconstruction of one k-tuple of information elements. A subsidiary condition that applies here is the placing of a constraint on the permissible number of errors in a running segment of $(u+1)$ successive n-tuples of code elements, in such a way that this reconstruction is possible.

In particular the invention relates to an apparatus for the reception of a stream of binary code elements which form a sequence of n-tuples of an (n,k,p) error-correcting convolutional code, where k/n is the ratio of the number of information elements to the number of code elements corresponding thereto and p is the encoding constraint length, which apparatus includes:

a. first syndrome-forming circuit for forming together with the reception of said sequence of n-tuples of code elements a sequence therefrom composed of $(n-k)$ tuples of binary syndrome elements;

b. a logical unit having first storage means for receiving said $(n-k)$-tuples of syndrome elements and for storing them temporarily during a time which corresponds to at least (u) bit cells, where u ($u \geq p$) is the decoding constraint length of said error-correcting convolutional code, and for forming, always together with the reception of an n-tuple of code elements of said sequence, from a predetermined running selection of said sequence of $(n-k)$-tuples of syndrome elements, an element of a sequence composed of j-tuples of binary correction elements at a first output of the logic unit, where for a systematic convolutional code $j=k$ and for a non-systematic convolutional code $j=n$;

c. a correction apparatus for storing at least the information containing part of the sequence of n-tuples of code elements during a time which corresponds to at least (u) bit cells and for thereafter adding this modulo 2 to the corresponding j-tuple of correction elements;

d. a feedback connection for supplying said sequence of j-tuples of correction elements to said logic unit for the updating of the $(n-k)$-tuples of syndrome elements stored there so as to compensate these for the effects of the correction executed on said sequence of n-tuples of code elements.

Such an apparatus is known from the U.S. Pat. No. 3,697,947. The quantity of errors correctable in a segment of $(u+1)$ n-tuples received is limited and dependent on the chosen values for n, k and p and on the value of u also determined thereby. More errors than this cannot be corrected correctly. If the number of errors in a segment is too large for a correct correction, there are two possibilities for the operation of the correcting algorithm: the correction can be erroneously omitted, or an incorrect correction is applied. In both cases there is a decoding error.

SUMMARY OF THE INVENTION

It is an object of the invention to provide in a feedback decoder according to the preamble simple means for designating, on the reception of n-tuples of code elements irremediably corrupted by disturbances, a segment of this sequence of n-tuples as unreliable. The invention realizes the objects in that the apparatus is characterized in that it also further includes:

e. second syndrome-forming circuit for forming at a second output always together with the execution of a correction by means of a j-tuple of correction elements an element of a sequence composed of $(n-k)$-tuples of binary secondary syndrome elements which are formable on the basis of the corrected sequence of n-tuples of code elements, where a first signal value of an $(n-k)$-tuple of binary secondary syndrome elements indicates that a correct correction can have taken place, and all other signal values that no correct correction has taken place;

f. detection circuit connected to said second output for detecting a secondary syndrome signal (residue signal) having an other value and if so, generating an unreliability signal during a time which corresponds to a second predetermined number of bit cells of said n-tuples of code elements.

In the environment in which the invention is used another measure can thereafter be taken to restore the information. In a data communication system this measure can consist in the repetition of a part of the data transfer. The philosophy behind the measures is that there exist two situations in which the $(n-k)$-tuples of syndrome elements continually have said first value (for example, 0..0/0..0/..../0..0), namely in the case of an undisturbed code sequence and also in the case of code sequence which is disturbed in such a way that the disturbance itself is to be understood as a correction code sequence. All other cases give almost certainly at least one $(n-k)$ tuple of syndrome elements which does not have the value (0..0). For $(n-k)=2$ this latter can thus be one of the values 01, 10 and 11.

It is advantageous if in said logic unit:

said first storage means have a capacity to store the received syndrome elements during at least u bit cells and operate as an address register so as to:

address a logic function generator by means of $(u+1)$ successive $(n-k)$-tuples of binary syndrome elements; and if said second syndrome-forming means are also embodied in said logic function generator, since unlike the address bits which originate from the u most recently received $(n-u)$-tuples of syndrome elements, further address bits from said logic function generator are excluded from said updating, where said second output also arises from said logic function generator.

This yields a simple scheme through common addressing for the logic function generator: in this way primary and secondary $(n-k)$-tuples of syndrome elements are generated in parallel. The logic function generator can be formed as for example a read-only memory (ROM).

It is advantageous if in said storage capacity of at least u bit cells the $(n-k)$-tuple of address elements originating from the least recently received $(n-k)$-tuple of syndrome elements operates as a provisional residue signal, and if a modification element is provided for receiving said provisional residue signal and to convert another value into said one signal value under control of a sequence of address signals for said logic function generator which indicate that the disturbance signalized in this way by said provisional residue signal is the first of a sequence of disturbances to be recognized by the logic function generator as correctable. Although non-systematic convolutional codes in themselves are as eligible as systematic convolutional codes the latter usually admit of simpler implementation. In the version described this yields a simple generation of the residue signal.

It is advantageous if said address register is provided with circuit for directly addressing said logic function generator once for each received $(n-k)$-tuple of syndrome elements with the address elements originating directly from the u most recently received $(n-k)$-tuples of syndrome elements so as to generate a k-tuple of correction elements and moreover for addressing said logic function generator once with the address elements originating from the most recently received $(n-k)$ tuples of syndrome elements with updating for a temporarily simulated k-tuple of correction elements so as to generate a control signal for said modification element. This yields a simplified construction of the logic function generator. In the case of implementation with a read-only memory (ROM) this can in particular have a smaller capacity.

It is advantageous if a third storage device or area is connected at the output of the corrector apparatus so as to store temporarily at least the information-containing part of the corrected n-tuples of code elements during a time which corresponds to a third predetermined number of bit cells of said n-tuples of code elements so as lastly to cause a delayed unreliability signal to be generated at the appearance of a possibly erroneously corrected n-tuple of code elements at an output of said third storage device. This prevents the propagation of the uncorrectable errors in further parts of the information-processing system, for example a descrambler, an arithmetic element or a reproducing instrument, for example an audio instrument: these further parts can then be notified in good time before the start of this propagation.

It is advantageous if a secondarily operating correction device is provided, having an information input connected to an output of said corrector apparatus, and an activation input is connected to said means of detection, so as under control of said unreliability signal to supplement a k-tuple of information elements recognized as possibly unamendable by one that has been derived from at least one further k-tuple of information elements. In this way an exact error correction can be completed in an attractive way with an approximative error correction, for example an averaging between two other signals. The residual error is then less troublesome in certain cases. A processing system for the information will then not change over directly to emergency actions. Said measure would for example be advantageous if the k-tuples of information elements represent a process parameter in an industrial control system.

It is advantageous if for $k \leq 2$ and $n-k=1$ at least two disturbances are correctable in a segment of $(u+1)$ n-tuples of successive code elements. This gives a good possibility of correction.

It is advantageous if for $k=1$ at least three disturbed n-tuples of code elements are correctable in a segment of $(u+1)$ n-tuples of successive code elements. This also gives a good possibility of correction.

It is advantageous if for a digital audio signal composed of f bits the k most significant thereof are always processed as a said k-tuple of information elements and the $f-k$-tuples are processed without error-correcting convolutional code. In this way in digital sound reproduction of music a high insensitivity to the notorious scratch and crackle disturbances can be realized with little redundancy.

It is advantageous if means of interleaving are provided for processing the terms of all sequences of signals cyclically modulo the interleaving factor built into the means of interleaving. In this way burst errors as well are more readily correctable. Burst errors are characterized by a disturbance in a number of successive n-tuples of code elements. If the interleaving factor is for example equal to three, the corrections are carried out on different classes of n-tuples, which for example comprise successively 1st, 4th, 7th ... n-tuple, 2nd, 5th, 8th ... n-tuple and 3rd, 6th, 9th ... n-tuple. If for each class there are three n-tuples per segment which are correctable, a burst of nine disturbed n-tuples can in principle still be correctable.

It is advantageous if the device is suitable for processing digital audio signals divided among at least two sound channels. An interleaving can then be implemented together with the splitting according to the source of the audio signals or otherwise. Disturbances which originate from mutually independent causes can thereby have less influence on the end result because the different channels are coded together. Applications are stereophony or quadrophony.

BRIEF DESCRIPTION OF THE FIGURES

The invention will be explained more fully hereinafter with the aid of several figures. After the discussion of an elementary block diagram the theory of the feedback decoders will first be treated briefly. The requirements to be imposed on convolutional codes will thereafter be explained and several attractive codes demonstrated. Next the formation of the residue signal and of the signal that signalizes an irremediable error combination will be explained. Finally several versions of feedback decoders will be discussed.

FIG. 6 gives for the case of FIG. 4 the values of an updated syndrome sequence where a correction is carried out.

FIG. 7 gives for the case of FIG. 4 the values of an updated syndrome sequence by means of which a residue signal can be generated.

GENERAL DESCRIPTION OF THE INVENTION

Figure 1A:
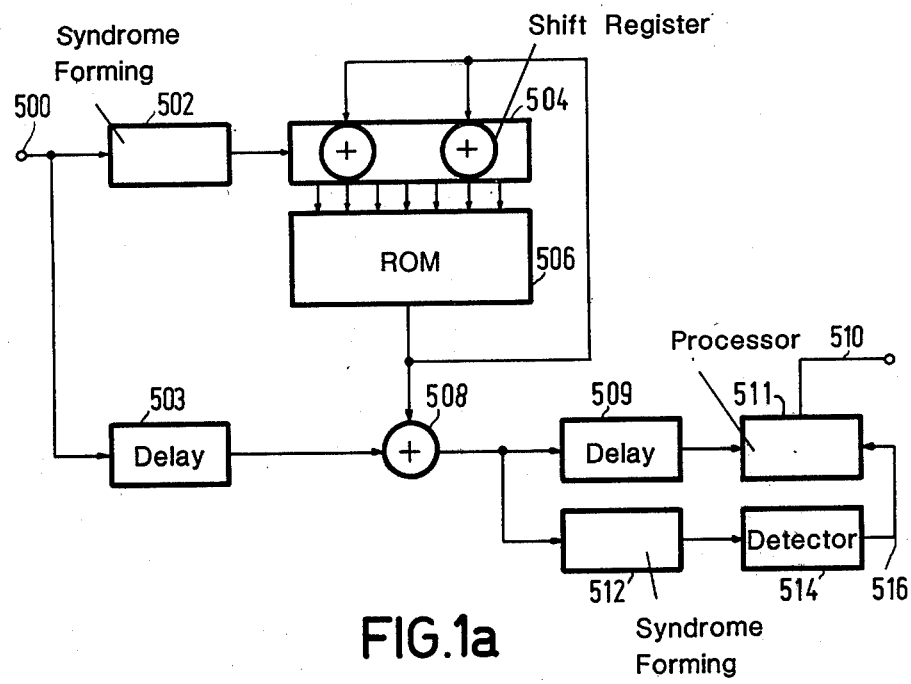
FIGS. 1a, 1b give two elementary block diagrams of apparatus according to the invention.

FIG. 1a gives an elementary block diagram of an apparatus according to the invention. The n-tuples of code elements appear at input 500. Block 502 comprises first syndrome-forming circuit for forming a sequence of syndrome signals. Element 504 is an address shift register which comprises modification elements in the form of (symbolically indicated) exclusive-OR elements. Element 506 is a read-only memory for forming, from a sequence of syndrome elements, a correction for the sequence of n-tuples. This correction is applied by means of EXCLUSIVE-OR element 508 which if necessary is multiple. Element 503 is delay element for delaying the n-tuples of code elements for as long as corresponds to the delay in the generation of the correction elements in read-only memory 506: this can relate to as many bit cells as the length of address register 504. The correction quantity for element 508 is also supplied to address shift register 504 in order to update the syndrome sequence by means of the Exclusive-OR elements in register 504 so as to compensate for the modification in the n-tuples of code elements which were received at input 500 and have now arrived at element 508. The modified information is supplied to second syndrome-forming means 512 so as to form secondary (n−k)-tuples of syndrome elements from the updated information. This so-called residue signal contains information relating to non-correctable errors: if the correction has been correct (and has thus been possible) this residue signal is composed for example entirely of zeros. The residue signal is supplied to detector 514 which is arranged so as to detect a non-zero syndrome signal and in this way to indicate an unreliable segment in the corrected sequence of n-tuples. This can for example be a counter which is reset to the zero state by a received "1" and counts forward by the clock. A particular state then indicates that the output signal is again reliable: this signalization appears at line 516. Another version of such an element is given in FIG. 4. Element 509 is again a delay element for compensating a possible detection delay in element 512. This detection delay can be influenced by the disturbance pattern in the n-tuples of code elements. Element 511 is a processing element which for example converts the restored n-tuples of code elements into the k-tuples of information elements again, if the signal on line 516 makes that possible. The user information finally becomes available on line 510.

Figure 1B:
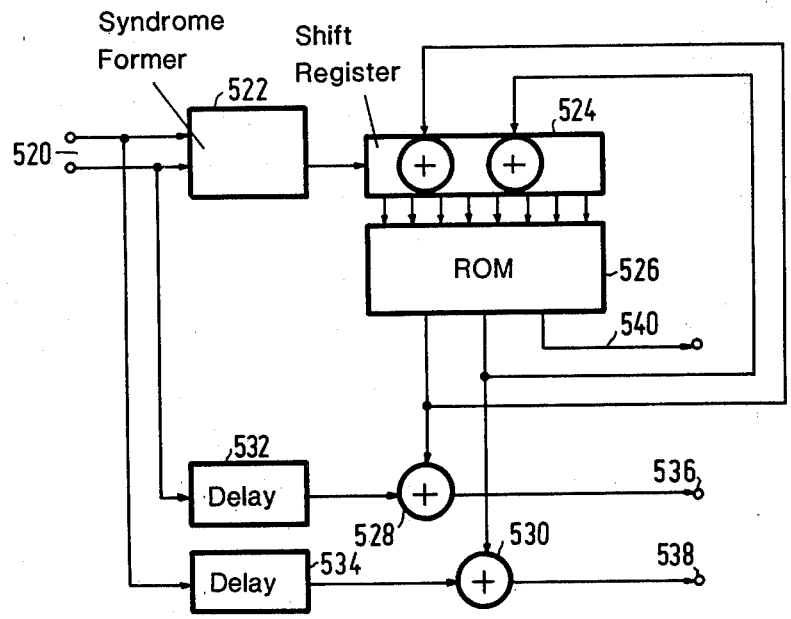

FIG. 1b gives a modified block diagram, in particular for a non-systematic convolutional code. For simplicity it is assumed that n=2 and k=1. The code bits appear at input 520. Element 522 is a syndrome former and thus gives a single sequence (n−k=1) of syndrome bits. These are stored in address shift register 524, which again is provided with means of modification in the form of schematically indicated EXCLUSIVE-OR elements. Element 526 is a read-only memory. Whenever a following syndrome bit is received in element 526, it gives in the first place two correction elements for the EXCLUSIVE-OR elements 528, 530 respectively. The blocks 532, 534 represent delay elements corresponding to element 503 in FIG. 1a. The corrected n-tuples of code elements appear at outputs 536, 538. Furthermore whenever a correction takes place (by means of elements 528, 530) a residue signal is delivered at output 540 by the read-only memory 526. This signal has the value 1 if the sequence of syndrome bits present at that instant in address shift register 524 is such that a further correction to the stream of n-tuples of code bits would still be necessary. This correction is then no longer useful, because of the limited error-correction capacity of the code. This residue bit is directly correlated with the value of the syndrome bit which (after modification if necessary) has originated from the least recently received syndrome bit in address register 524. The further processing of residue signal and information/code signals has already been discussed for the case of FIG. 1a.

THEORETICAL BASIS OF THE INVENTION

The formation of the n-tuples of code elements from the k-tuples of information elements (with n greater than k), where only the information (data) elements are relevant for a user, takes place according to the formula:

$$y(j) = G0 \cdot x(j) \oplus G1 \cdot x(j-1) \oplus G2 \cdot x(j-2) \ldots \oplus Gp \cdot x(j-p), \quad (1)$$

where (j), (j−p), et cetera are running indices and the quantities G(0) ... G(p) are matrices with a dimension of (nxk) elements each of which can only be 0 or 1. All elementary operations take place modulo 2, while at least the matrices G(0) and G(p) are not identically equal to zero. The number p is the encoding constraint length. The code is systematic if all the information bits of a k-tuple again form part of an n-tuple of code bits, or can be derived from k code bits of an undisturbed k-tuple of code bits respectively. For the reconstructing of the information bits a syndrome sequence is formed which is composed of (n−k)-tuples: s(j), s(j+1), s(j+2), ... by means of the following operation on the n-tuples y'(j) possibly corrupted by errors. This possible error is indicated here by an accent:

$$s(j)=H_0 \cdot y'(j) \oplus H_1 \cdot y'(j-1) \oplus H_2 \cdot y'(j-2) \oplus H_p \cdot y'(j-p). \quad (2)$$

expanding into terms gives:

$$s(0)=H_{o \cdot y}(o)$$

$$s(1)=H_{o \cdot y}(1)+H_{1 \cdot y}(o)$$

$$s(2)=H_{o \cdot y}(2)+H_{1 \cdot y}(1)+H_{2 \cdot y}(o)$$

et cetera. Here Hi always represents a matrix with a dimension of (n−k)xn elements, which elements can have only the values 0 and 1. The matrices Hi satisfy a defining equation to be discussed later, related to the matrices Gi. In the special case of a convolutional code the formation of the syndrome amounts to the bit-by-bit addition of the sequence of received parity bits and the sequence of reconstructed parity bits. Examples will be given hereinafter. The above description is valid for all convolutional codes. Necessary and sufficient conditions for a technically interesting convolutional code (namely one which can correct the error in a number ≥ 1 of disturbed n-tuples of code elements) will be discussed hereinafter.

Now it is the intention to reconstruct the original information bits, which can be done with a feedback decoder. This is defined by the following two equations:

$$t(i+1)=A \cdot t(i) \oplus B \cdot s(i) \oplus C f\{s(i),t(i)\} \quad (3)$$

$$y''(i-u)=f\{s(i),t(i)\} \oplus y'(i-u) \quad (4)$$

Figure 2:
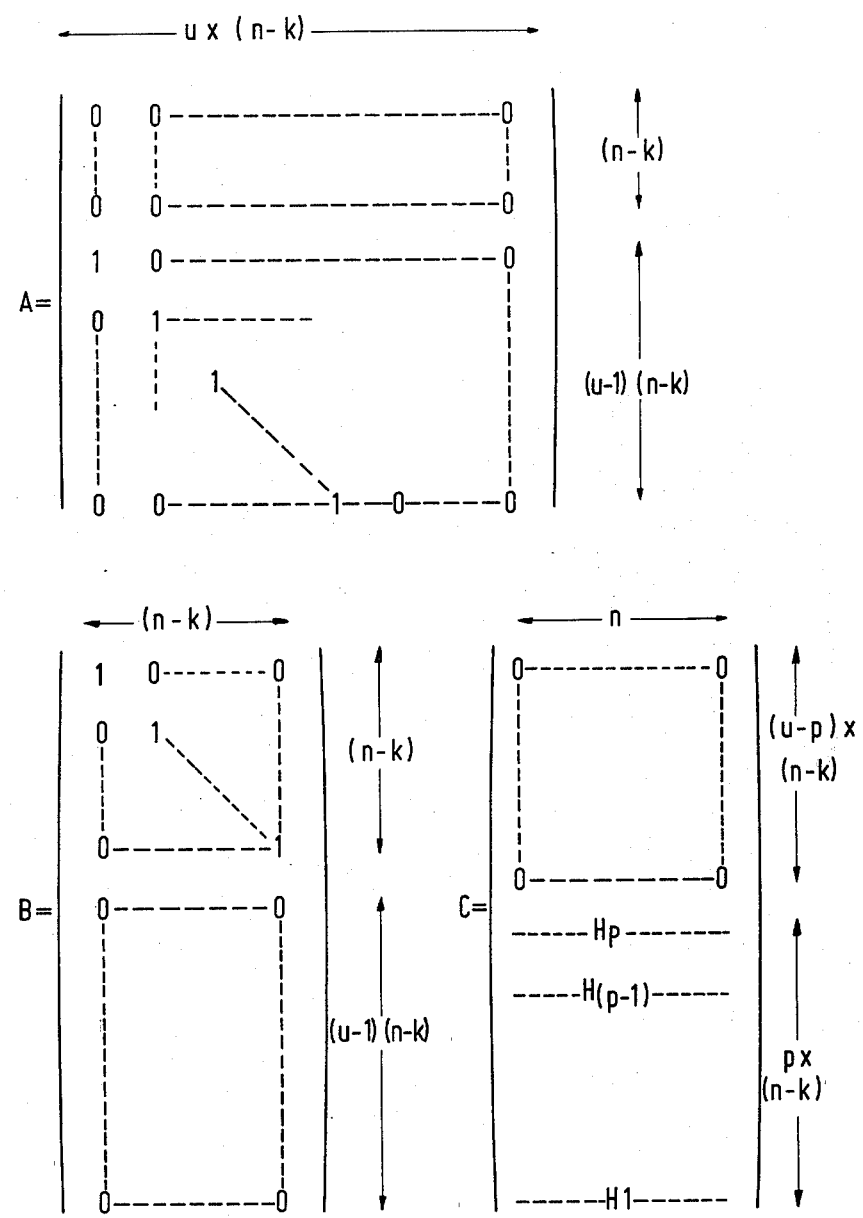
FIG. 2 gives three matrices A, B, C for the updating of the syndrome sequence of the convolutional code.

Here u is a natural number which is greater than or equal to p and is called the decoding constraint length. Furthermore (i), (i−u), and so on are running indices. The quantity t(i) is called the updated syndrome; it is a vector with the dimension u×(n−k), and for which the elements can only have the values zero and 1. The letters A, B and C represent three matrices which are depicted in FIG. 2. The matrix A has a dimension of {u×(n−k)} square. The matrix B has a dimension of u×(n−k) by (n−k). The matrix C has a dimension of n by u·(n−k). In particular the matrix C therefore comprises all the matrices H1, H2 ... Hp which have been pointed out above.

Through the function f{s(i),t(i)} an estimate is made of the disturbance e(i−u) in the n-tuple y(i−u). The latter equation (4) describes the execution of a correction. If f{s(i),t(i)} has the value o then no correction is executed on y'(i−u), in other cases a correction is executed.

The feedback decoder operates as follows. Assume that the decoder detects a first disturbed n-tuple in the received sequence of n-tuples of code elements. Within one and the same n-tuple the errors do not have to be independent. Assume that the decoder is able to detect the value of the disturbance e(i−u) from a sequence of finite length of syndrome symbols s(i−u), s(i−u+1) ... s(i). The sequence of received n-tuples is corrected by the expression (4) for y''(i−u). The term C·f{s(i),t(i)} = C·e(i−u) then indicates the influence of precisely this disturbance e(i−u) on the syndrome sequence.

In the correction of the sequence of n-tuples the syndrome sequence also is now directly updated by removing the disturbing influence of e(i−u) from it again. In this way only the first error from a (possible) sequence of errors therefore always needs to be recognized on the basis of a finite number of (n−k)-tuples of the syndrome which are still continuously updated. The requirements to be placed on the function f{s(i),t(i)} will be discussed hereinafter.

The expression for t(i+1) will next be considered further. If e(i−u) is the first disturbance from a (possible) sequence of disturbances, then t(i) can be partitioned vectorially by means of the following matrix equation, in which each line relates to an element of the vector t(i):

$$\begin{bmatrix} u-1 \\ t(i) \\ \cdots \\ u-2 \\ t(i) \\ \cdots \\ \vdots \\ t(i)^o \end{bmatrix} = \begin{bmatrix} s(i-1) \\ \\ s(i-2) \\ \\ \\ s(i-u) \end{bmatrix}$$

This therefore concerns u syndrome symbols and the height of the matrices is thus u(n−k) elements. In the above the updating of the syndrome quantities has not yet taken place. The disturbance e(i−u) is thus reconstructed as:

$$e(i-u)=f\{s(i),t(i)\}$$

Substituting j=i−u in equation (2) describes the partial effects due to the disturbance e(i−u) on the respective terms of the syndrome sequence:

| | |
|---|---|
| s (i − u) | contains an effect H 0.e (i − u) |
| s (i − u + 1) | contains an effect H 1.e (i − u) |
| . | |
| . | |
| . | |
| s (i − u + p) | contains an effect H p.e (i − u) |
| s (i − u + p + 1) | contains an effect O |
| . | |
| . | |
| s (i) | contains an effect O |

The lines s(i−u+p+1) ... s (i) contain no disturbance and from this the difference between encoding constraint length p and decoding constraint length u can therefore be seen. If p=u the right-hand column therefore contains no terms equal to 0. The influence of the matrix A on the updating of the syndrome symbols is that the effects are shifted to the bottom (u−i).(n−k) matrix lines (downshift) and that the top (n−k) lines contain only zeros (truncate). The matrix B ensures that the updated syndrome symbols appear at the correct place in the updated syndrome sequence. The matrix C comprises the array of the partial effects due to the disturbance.

DESCRIPTION OF SUITABLE CONVOLUTIONAL CODES

Convolutional codes can easily be described by means of the D-transformation. This is based on a sequence of elements $\underline{Z}(m)$, $\underline{Z}(m+1)$, $\underline{Z}(m+2)$ . . . , in which m is a running index. In connection with the above $\underline{Z}$ is for example a sequence of n-tuples of information bits. This sequence can contain the same terms at different places. With the aid of the delay operator D the transform $\underline{Z}$ (D) of such a sequence becomes:

$$\underline{Z}(D) = \underline{Z}(m) \cdot D^m + \underline{Z}(m+1) \cdot D^{m+1} + \underline{Z}(m+2) \cdot D^{m+2} + \ldots$$

It is found that convolutions between sequences are directly related to the multiplication of their transforms as above. A time interval of the length of a bit cell is chosen for D. In this way the formation of the n-tuples of code elements can be written according to the formula (1) discussed as y (D)=G (D)·x (D), where G(D) is a matrix of dimension nxk and defined as:

$$G(D) = G(0)D^0 + G(1)D^1 + \ldots + G(u)D^u.$$

Each element of the matrix G(D), hence g (i, j) (D) is now a polynomial in the delay operator D with coefficients 0 or 1.

The coding can be described by means of a parity-check matrix, H (D). This matrix has a dimension of $(n-k) \times n$ elements h (i, j). Each element is again a polynomial in the delay operator D with coefficients 0 or 1. This matrix satisfies the equation:

$$H(D) \cdot G(D) = 0$$

Expanding this gives:

$$\sum_{i=0}^{j} H(i) G(j-i) = O$$

for all values of j for which $0 \leq (j) \leq p$. For every code sequence with elements y (j) then:

$$H(D) \cdot y(D) = 0$$

In the case of a possibly disturbed code sequence the syndrome sequence $$s(D) = H(D) \cdot y'(D) = H(D) \cdot \{y(D) \oplus e(D)\} = H(D) \cdot e(D)$$

is defined. If the error sequence itself forms a code sequence then this error is neither detectable nor correctable.

In a feedback decoder having decoding constraint length u an element from the sequence of $(n-k)$-tuples of syndrome elements s (m) . . . s (m+u) is always formed from a segment of the code sequence of n-tuples y (m) . . . y (m+u). This then depends entirely on a corresponding element of a segment from the error sequence: e (m) . . . e (m+u). In the correction the value of e (m) must be determined from the syndrome segment. In a serially operating decoder this is the element of the segment that arrived first. Let the code be designed in such a way that at most q n-tuples or errors are correctable in the segment of length u. In the quoted U.S. Pat. No. 3,697,947 q=1. The error e (m) is found from the syndrome segment by a reference function. This reference is correct for the condition that there is no second error sequence e'(m) . . . e'(m+u), for which e (m) $\neq$ e' (m), which yields the same syndrome segment as e (m) . . . e (m+u), and nevertheless contains only at most q n-tuples which are unequal to zero. The weight of a segment is to be understood as the number of n-tuples of that error segment which are not equal to 0. Let an abbreviated notation for the segment of the n-tuples e (m) . . . e (m+u) be (after transformation):

$$[e(D)]_m^{m+u}$$

Furthermore let the sum of two segments be the segment which is generated by modulo-2 addition of the corresponding n-tuples. An initial segment of length (u+1) of a code is to be understood as a segment $$[y(D)]_o^u,$$

where y (D) is the transform of a code sequence having y(0) as first n-tuple differing from zero. Let the minimum weight d (u) of a convolutional code be the minimum of the weights of all the possible initial segments of length (u+1) of the code. The syndrome segment $$[s(D)]_o^u$$

which is generated on the basis of an initial segment $$[y(D)]_o^u$$

is composed entirely of zeros, which follows from the aforementioned equation (2) and from the fact that y (D) represents an undisturbed sequence of n-tuples of code elements. If now e (D) and e' (D) are two error sequences for which e (0) and e' (0) are mutually different and both unequal to zero, while all earlier disturbances had the value zero, then these error sequences give then and only then the same syndrome segment if the truncated (broken-off) sum:

$$[e(D) \oplus e'(D)]_o^u$$

is an initial segment of the convolutional code. A convolutional code with decoding constraint length u can then correct a number Q ($\geq 1$) of disturbed n-tuples wthin a segment of (u+1) seccessive n-tuples if the above-defined minimum weight of that initial segment of the code is at least equal to:

$$d(u) \geq (2q+1)$$

Figure 3:
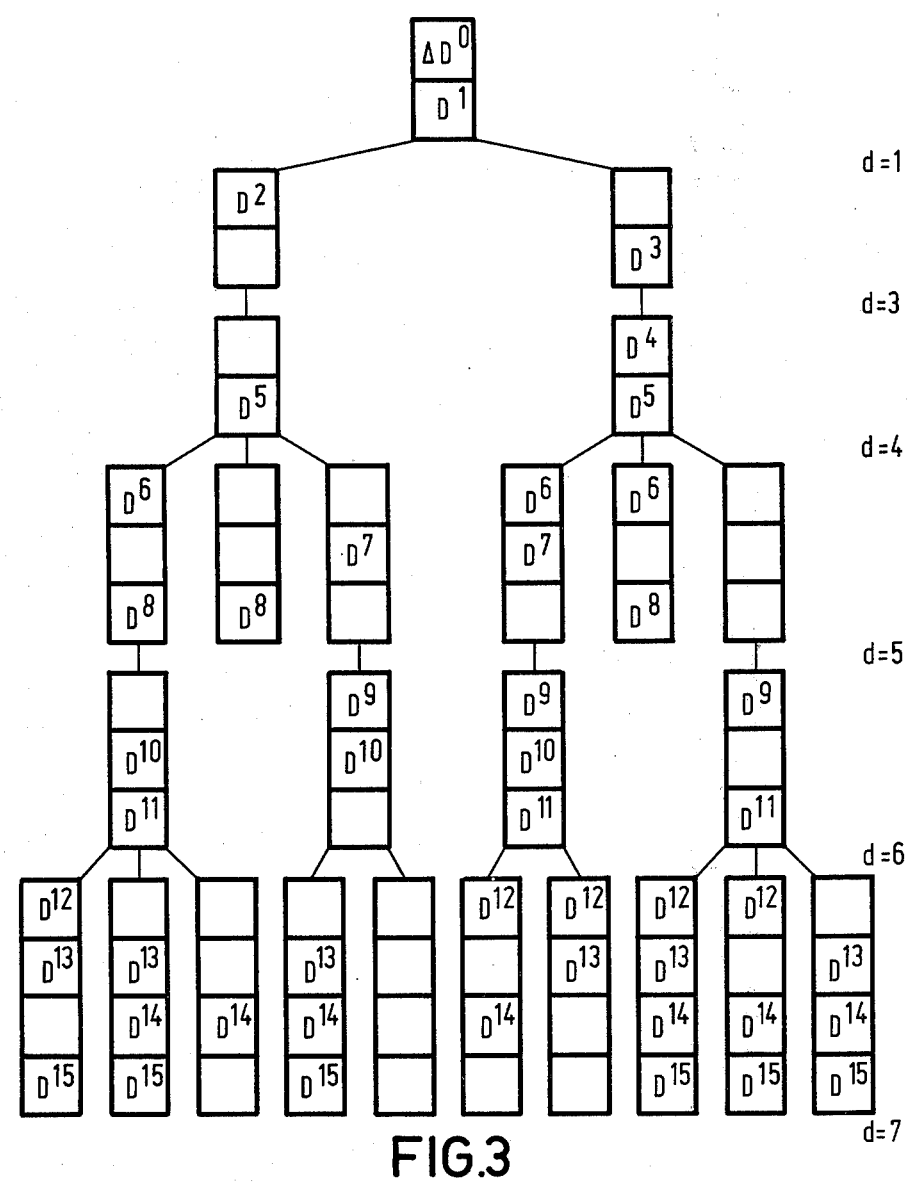
FIG. 3 gives a schematic presentation of a number of preferred codes.

An (n,k,p) convolutional code is now said to be q-fold error correcting if a finite number u exists such that every disturbance of the sequence of n-tuples of code elements which influences at most q u-tuples in each segment of (u+1) successive n-tuples is still correctable. If the efficiency (k/n) is fixed, then for a fixed value of q the smallest value of u is aimed at. The minimum weight d (j) as defined above is now determined by the set of all the initial segments of the code having length (j+1) n-tuples. If two codes possess the same set of initial segments having length (u+1) they therefore have the same weight provided $0 \leq j \leq u$. The generator matrix G (D) of a convolutional code having n=2 and k=1 has the following form:

$$G(D) = \begin{bmatrix} a(D) \\ \hline b(D) \end{bmatrix}$$

Where a (D) and b (D) are polynomials in the delay operator with the length of a bit cell D, having the degrees of the polynomials $P_a$ and $P_b$ respectively. The set of all the code sequences of n-tuples then has associated with it the expression $$y(D) = \begin{bmatrix} y_1(D) \\ \hline y_2(D) \end{bmatrix} = \begin{bmatrix} a(D) \\ \hline b(D) \end{bmatrix} \cdot x(D),$$

which denotes the formation of the n-tuples of code elements from the k-tuples of information elements. In their simplest notation the polynomials a (D) and b (D) contain no common factor, not even one which is itself an expression in D. Therefore a (D) and b (D) possess no common factor so that the first term of either, for example of a (D) is unequal to zero. It can be proved that a generator matrix exists of the form $$G'(D) = \begin{bmatrix} 1 \\ \hline \dot{z}(D) \end{bmatrix}.$$

where the degree of $\dot{z}$ (D) is smaller than or equal to u of a code which has the same weight profile as the code generated by G (D). This means that for the investigation of the error-correction properties of n=2, k=1 convolutional codes only the systematic codes as these were defined earlier need be considered. It is moreover found that $\dot{z}$ (D)=$\dot{z}$(0)D⁰+$\dot{z}$(1) D¹ the generator matrix $$G''(D) = \begin{bmatrix} 1 \\ \hline \dot{z}'(D) \end{bmatrix}$$

generates a code with the same weight profile and therefore the same capacity for the correction of errors as G' (D) which has been defined earlier. In this connection FIG. 3 gives a schematic presentation of a number of preferred codes having k=1 and n=2. Each branch of the tree structure indicates a generator polynomial, where the terms are indicated in each case. The term D⁰ is always optional. The branch on the furthest left of the tree structure is characterized by a generator polynomial having the following powers of the delay operator D.

D⁰ (optional), D¹, D², D⁵, D⁶, D⁸, D¹⁰, D¹¹, D¹², D¹³, D¹⁵.

This code is fully specified thereby. In this case the decoding constraint length is u=15. For this value of u this is one of the codes which have the greatest weight, which property has been defined earlier. In this case moreover p=u=15, while d=7. By these means three disturbed n-tuples per segment of (u+1) n-tuples of code elements are correctable. By keeping D¹¹ as the highest term in the generator polynomial two disturbances are correctable and in addition one is detectable. With D⁸ as the highest term two disturbed n-tuples are correctable (d=5). The following table indicates the desired value of d and the minimum decoding constraint length u necessary for this:

| d | u | d | u |
|---|---|---|---|
| 1 | 0 | 5 | 8 |
| 2 | 1 | 6 | 11 |
| 3 | 3 | 7 | 15 |
| 4 | 5 |   |    |

The compact notation of FIG. 3 therefore gives for the correction of three n-tuples per segment, twenty codes; for the correction of two n-tuples per segment, twelve codes; and for the correction of one n-tuple per segment four codes (each branch counts twice because the indication ΔD⁰ means that the term in D⁰ is optional). The value of p can therefore be lower than the value of u. For the furthest right-hand branch and for d=5: u=8, but p=5, since the last three terms do not occur. This makes possible a simplification of the encoding circuit. Other codes having the same correction capacities per segment are possible, but for these the value of u is always greater than the minimum. In relation to the information stream these therefore have a smaller average correction capacity. The average error-correction capacity for the codes shown having u=15 is somewhat smaller than that for the codes having u=8. But for u=15 a greater local concentration of errors can be corrected.

FORMATION OF THE RESIDUE SIGNAL

The formation of the residue, which is composed of a sequence of (n-k)-tuples, will be described next. This has the same form as the syndrome sequence. The purpose of the residue information is to indicate, at the encounter with an uncorrectable disturbance, an interval in the sequence of n-tuples of code elements, during which interval this information will be uncorrectable. In the first place the matrix Ho, defined earlier, does not occur as the submatrix of the likewise previously described matrix C. Let us consider a syndrome segment partitioned as follows:

$$t(i) = \begin{bmatrix} s'(i-1) \\ s''(i-u) \end{bmatrix}$$

where the vectors s' (j) having a length of (n−k) represent elements of the momentarily updated (n−k)-tuples of the syndrome sequence. The indices of the following syndrome segment t(i+1) run from (i−u+1) to (i+1) and therefore no component s'' (i−u) is present herein to which a correction by means of Ho.f{s(i), t(i)} could relate. In an error sequence which is completely correctable the relation:

$$e(i-u)=f\{s(i),t(i)\}$$

holds for each disturbance. Now if the (n−k) tuple s'' (i−u) has the rank number (i−u) in the updated syndrome sequence for which e (i−u) represents the first disturbance n-tuple, then in the case of correct decoding the relation $$s''(i-u) \oplus Ho \cdot f\{s(i),t(i)\} = 0$$

must be satisfied, for the syndrome is formed by means of causal relations. If the decoding process fails, that is, an error is erroneously not corrected or a correct signal is erroneously modified, then it is in principle possible that the aforesaid equation has not been satisfied. A signal quantity new in conception is therefore defined which is called the residue signal. The defining equation is:

$$r(i-u) = s''(i-u) \oplus H_0[f\{s(i),t(i)\}]$$

The residue signal is determined by the syndrome sequence and hence indirectly by the error sequence. The formation of the residue gives a post check on the decoding process, for through the reconstruction of the error sequence there arises directly the possibility of reconstructing again thereby the appertaining syndrome sequence. In the case of a correct decoding (hence all disturbances restored and all undisturbed code elements maintained unchanged) the reconstructed syndrome sequence should coincide with the original constructed syndrome sequence.

Two further quantities are also of interest: the first is the maximum detection delay. If $y''$ (m) is the first disturbed n-tuple of code elements which forms part of a segment of the code sequence, in which segment an uncorrectable, but indeed detectable error is present, and if this as first non-zero residue signal ((n−k)-tuple) causes the element r (m+w), then w is the detection delay. Within a certain class of disturbances to be detected in this way the value of w possesses a finite maximum.

The second quantity is the maximum sequence (run length) of residue signals which have the value "0" and therefore each in themselves indicate the undisturbed state, while the n-tuples of code elements do indeed contain an uncorrectable error which does however belong to aforesaid class of errors to be detected. Such a sequence of residue signals equal to zero will therefore be preceded by a signal not equal to 0 and followed by a signal unequal to 0. Here also within a certain class of errors to be detected in this way a maximum value is to be found for successive residue signals having the value zero. Both the maximum detection delay as well as the maximum length of said sequence of residue signals equal to zero are for example to be found by simulation by means of a computer. The consequences for the construction of a decoding machine will be discussed hereinafter.

DETAILED DESCRIPTION OF THREE PREFERRED VERSIONS

Figures 4, 5:
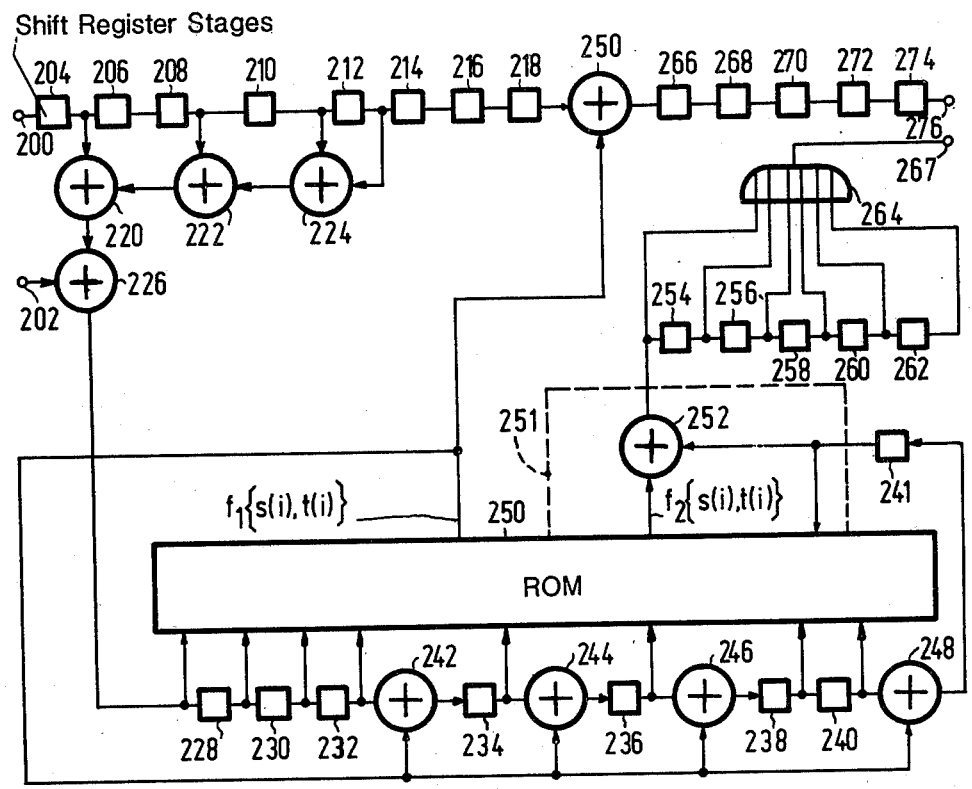
FIG. 4 gives an apparatus for the correction of errors with the aid of a convolutional code and for the signalizing of non-correctable errors.
FIG. 5 gives the system equation expanded for the feedback decoder in FIG. 4.

FIG. 4 gives a detailed diagram of an apparatus for the correction of a stream of information elements protected by a convolutional code. The code is linear and systematic. The information elements appear one by one, hence the value of $k=1$. Together with each information element there always appears a parity bit, hence the value of $n=2$. The protection which is realized with this scheme extends so far that all error patterns which contain per segment of $(u+1)=9$ directly successive pairs at most two pairs having a random error are correctable. Furthermore there is an apparatus for the signalization of uncorrectable errors in such a segment. There is a clock system, not shown, which gives a clock pulse in every bit cell. Small squares indicate in each case bistable elements (shift-register stages) which store under the control of such a clock pulse the information at their data input during the time of a bit cell. For simplicity these clockpulse connections have been omitted. In the scheme of this figure during each bit cell an information bit arrives at terminal 200 and a parity bit arrives at terminal 202. The code has an encoding constraint length of 5 and a decoding constraint length of 8. In FIG. 3 it is the branch on the furthest right of the tree structure where the terms $D^1$, $D^3$, $D^4$ and $D^5$ are therefore used for the determination of a parity bit. The term with $D^0$ is not used. The sequence of information bits is stored in an eight-bit shift register having stages 204-218. By means of taps from the stages 204, 208, 210, 212 and three Exclusive-OR elements 220, 222, 224 a stream of parity elements having the same generator polynomial with which the parity bits were formed at the transmitting end is reconstructed from the received, possibly disturbed, information elements. The stage 204 in this version serves only to make the two bits of each n-tuple keep time with one another. The reconstructed parity bits are added in Exclusive-OR elements 226 to the received sequence of parity bits. In this way a sequence of (n−k)-tuples of syndrome bits is generated. The syndrome bits are supplied to an eight-bit shift register, which comprises the stages 228-241 and furthermore four Exclusive-OR gates 242-248 for updating the sequence of syndrome bits. In this simple example the matrices G0 to G5 inclusive therefore have the following form:

$$G0 = \begin{pmatrix} 1 \\ 0 \end{pmatrix} ; G1 = \begin{pmatrix} 0 \\ 1 \end{pmatrix} ; G2 = \begin{pmatrix} 0 \\ 0 \end{pmatrix} ;$$

$$G3 = \begin{pmatrix} 0 \\ 1 \end{pmatrix} ; G4 = \begin{pmatrix} 0 \\ 1 \end{pmatrix} ; G5 = \begin{pmatrix} 0 \\ 1 \end{pmatrix} .$$

In a corresponding manner the matrices H0 to H5 inclusive have the form:

$$H0 = (01); H1 = (10); H2 = (00); H3 (10); H4 = (10); H5 = (10)$$

In this connection FIG. 5. gives the expanded system equation of the feedback decoder, in which in this case very simple versions of the matrices according to FIG. 2 have been included. The function $f_1\{s(i), t(i)\}$ ensures the updating of the information bits and hence also the updating of the syndrome bits by means of the EXCLUSIVE-OR gates 242-248. The function $f_2\{s(i), t(i)\}$ is used for the updating of the syndrome bits, after successive correction thereof, by means of $f_1\{s(i), t(i)\}$, whereby the secondary syndrome bits or residue bits are generated. The functions $f_1$ and $f_2$ are therefore in principle two different functions. Since the convolutional code is systematic, the last column of the matrix C is composed entirely of element 0, with this matrix not of course containing the matrix H0.

This code can correct two disturbed two-tuples from a segment of $u+1=9$ two-tuples. In this way the logic function to be formed by the read-only memory 250 can be found. For most of the addresses the value of $f_1=0$ and the information EXCLUSIVE-OR gate 250 is passed on unchanged. It is only for the addresses indicated in FIG. 6 that the function f1 has the value 1 and the information is modified. Here the unmodified syndrome s (i) therefore appears at the output of EXCLUSIVE-OR element 226 and the successive elements of t (i) in order at the outputs of shift register stages 228 to 241 inclusive. The column (0) of FIG. 6 therefore relates to the least recently arrived syndrome signals. The elements d1, d2 represent mutually independent arbitrary bit values 0, 1 (don't cares). The first line gives the influence on the syndrome of a single disturbed two-tuple for which the information bit has arrived correctly in element 218. The quantity d1 here indicates the arbitrary value of the parity bit of that two-tuple. The lines 2 to 8a inclusive give the nine possibilities for the combination of two disturbed 2-tuples, where the second disturbed 2-tuple has only an erroneous parity bit. In line 2 therein the second address bit is therefore inverted with respect to line 1, in line 3 the third, et cetera (the inversion of the first address bit has of course already been included in the first line). The lines 9 to 15a inclusive relate in each case to two disturbed 2-tuples which both contain an error in the information bit. They arise by shifting line 1 to the right and then adding to the unshifted line 2. The addition is again modulo 2 and (d2+1)=d2, (d2+0)=d2. Line 8a is a special case of line 15. Line 15a is a special case of (line 1 or line 15). These lines 8a, 15a are therefore not implemented. The quantity d1 appearing repeatedly in the first column means that the information from element 241 is not relevant here for the addressing, and that the connection in question to read-only memory 250 could be omitted in so far as the implementation of FIG. 6 is concerned.

In a corresponding manner the function $f_2\{s(i), t(i)\}$ is found. For most of the addresses $f_2=0$ and the modified syndrome bits from shift-register stage 241 are passed unchanged in EXCLUSIVE-OR gate 252. Only for the addresses which are indicated in FIG. 7 does the function $f_2$ have the value 1 and is the output information from stage 241 modified again. $f_2$ has in the first place the value 1 if the address is given by one of the addresses of FIG. 6, where d1 has the value 1. Line 2 from FIG. 6 then gives one disturbed two-tuple having an information error as well as a parity error. The disturbance in the information bit is corrected by means of the function $f_1$, the syndrome being corrected at the same time for the change in the information. The correction of the syndrome bit for the (not actually executed) correction of the parity bit then takes place by means of element 252 so that no further "1" signal appears at the output thereof. For the remaining addresses from FIG. 6 corresponding principles apply.

FIG. 7 gives a number of further addresses for which the function $f_2$ has the value 1. The element $d_3$ is again an arbitrary (don't care) information value which is independent of $d_1$ and $d_2$. Line 16 indicates a single error in a parity bit. This is passed unchanged by each of the elements 242, 244, 246, 248 and is corrected only in element 252. Lines 17 to 23a inclusive are generated under the influence of two disturbed 2-tuples having only the parity bit disturbed in each case. These lines are generated by shifting line 16 to the right and adding it to itself. Lines 24 to 30a inclusive are generated by a sequential order of a disturbed parity bit and thereafter a two-tuple in which certainly the information bit (and possibly also the parity bit) is disturbed. These lines are generated by adding the shifted line 1 (FIG. 6) to line 16. In all these cases the syndrome signal is updated, both for corrections in the information bits and for the disturbances in the parity bits. Also, the word 23a forms a special case of the address word 30 and word 30a is a special case of word 16 or word 30. The words 23a and 30a are therefore not implemented separately. In this way a stream of secondary syndrome bits (actually (n−k)-tuples, but n−k=1) is generated at the output EXCLUSIVE-OR element. If a syndrome bit has the value "0", indication is given thereby that the information, if disturbed, has possibly been correctly corrected. If a syndrome bit has the value "1" then reference is made thereby to a sequence of n-tuples (k-tuples here, on account of the systematic code) which contains an uncorrectable error. The converse is not true, for an uncorrectable error can quite well cause a sequence having both zeros and ones at the output of element 252. A further series of shift-register stages is therefore provided so as to store the secondary syndrome bits during in this case five bit cells. This shift register is connected to the OR gate 264 and an unreliability signal appears at output 226 if at least one of the inputs of the OR gate 264 carries a logic signal "1". The length of shift register 254/262 is determined by the longest possible sequence of zero signals which can occur for an error sequence which the apparatus must be able to detect. The choice of the errors to be detected is a design parameter. At the output of EXCLUSIVE-OR element 250 the shift-register stages 266 to 274 inclusive are connected so as to store the corrected information elements during a number of bit cells, since it is possible that the signal at terminal 266 assumes un unreliability value only after a delay. This delay depends on the disturbance pattern. The delay of the information elements must be sufficiently large that it is at least equal to the maximum delay of the unreliability signal at terminal 266 in connection with the class of errors, which, although uncorrectable, have to be detected by the apparatus. The numbers of shift-register stages 254/262 and 266/274 can be equal to one another, but this is not necessary. However, these numbers will as a rule be smaller than the numbers of shift-register stages 206/218. If the code is not systematic the function f is composed of n-tuples of correction elements, and the function f of (n−k)-tuples of secondary syndrome elements, where (n−k) is always ≧1. From the aforementioned (n−k)-tuples an OR function is then formed again so as to signalize an unreliability signal. A user's apparatus can be connected at the output 276. In the case of a non-systematic code this also comprises an apparatus for regenerating the k-tuples of information elements.

In respect of the scheme in FIG. 1 the syndrome-forming means 512 in FIG. 4 are included in the logic function generator 506 (here a read-only memory), so that element 514 is connected to a second output of element 506. Instead of a read-only memory a programmable or otherwise logic arrangement (array) or PLA can be used. Consideration of the FIGS. 6, 7 also shows that FIG. 7 can be obtained by performing the following operations:

a. dl is replaced by a "1", b. the word W=010111000 is added to the line content, and hence to the address.

Figure 8:
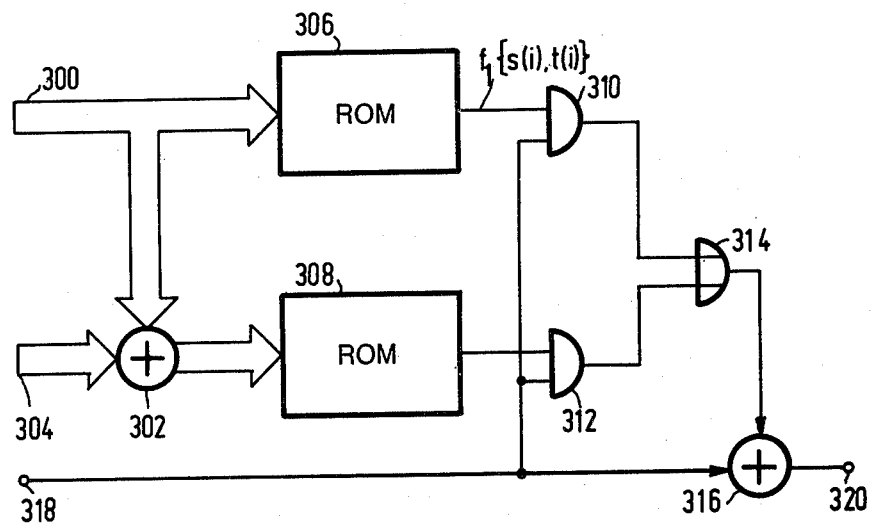
FIG. 8 gives a further implementation of the circuit of FIG. 4.

Here for the systematic code with k=n−k=1 the "1" bits in the word W correspond to the feedback connections to the address register as these are specified by the matrix C described earlier (FIG. 2). A first system implementation, parallel to FIG. 4, is indicated in FIG. 8.

At input 300 the flow of syndrome bits enters and this is (not indicated) updated for the correction of the stream of information bits. The read-only memory 306 provides the function $f_1$, as shown in FIG. 6. This function is of course used for correcting the information elements and compensating the syndrome sequence for this, but for brevity this is not shown. Furthermore $f_1$ is supplied to the AND gate 310. At input 304 the word W which has been defined above is generated by means not shown.

This is added modulo-2 to the operative updated syndrome sequence in the symbolically indicated adder element 302. The read-only memory 308 is identical with the read-only memory 306 but is addressed by another address word: Hence in this way is generated:

$$f_1\{s(i), r(i) \oplus W\}$$

Figure 9:
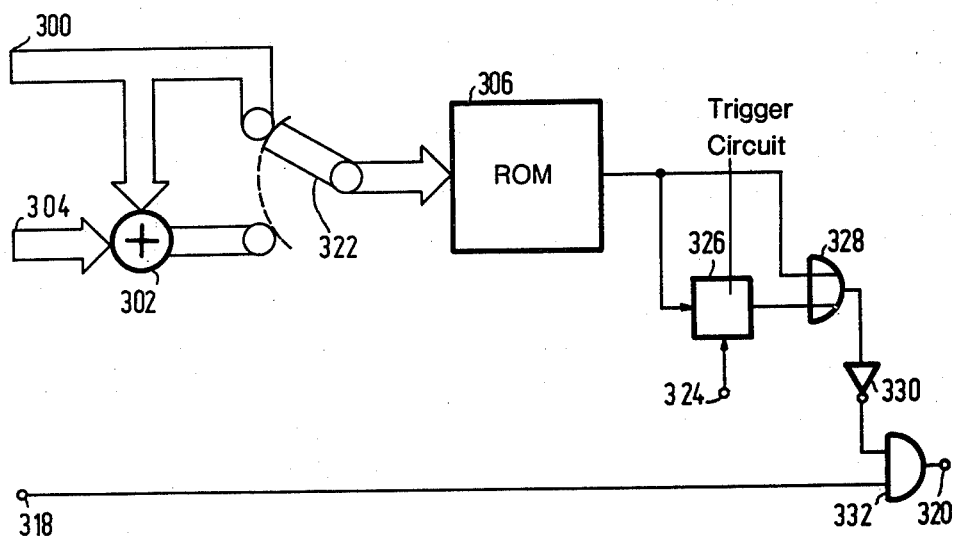
FIG. 9 gives yet another implementation of the circuit according to FIG. 4.

At terminal 318 the least recent syndrome bit of the address word appears. By means of AND gates 310, 312 and OR gate 314 the two output functions of the read-only memories 306, 308 are added so as to modify said least recent syndrome bit in EXCLUSIVE-OR element 316 if necessary. The residue signal therefore always appears at output 320. In this way the influence of dl in FIG. 6 is therefore dominant over the "1" which occurs in FIG. 7 in the first column. Instead of with the aid of an EXCLUSIVE-OR element 316, the modification of the signal at terminal 318 can also be executed with another logic function, as shown in FIG. 3. The output signals from the read-only memory must then be adapted in the proper way. In this connection FIG. 9 gives a simplification of FIG. 8, where in particular a reduced storage capacity in the read-only memory 250 of FIG. 4 would be necessary ($256 \times 1$ instead of $256 \times 2$ bits). Corresponding elements are numbered as in FIG. 8. Element 322 is a changeover switch energized by the clock. Element 326 is a trigger circuit energized by the clock at input 324. Element 328 is an OR gate and 322 an AND gate and element 330 is an inverting buffer with small delay with respect to the clock-pulse period.

Figure 10:
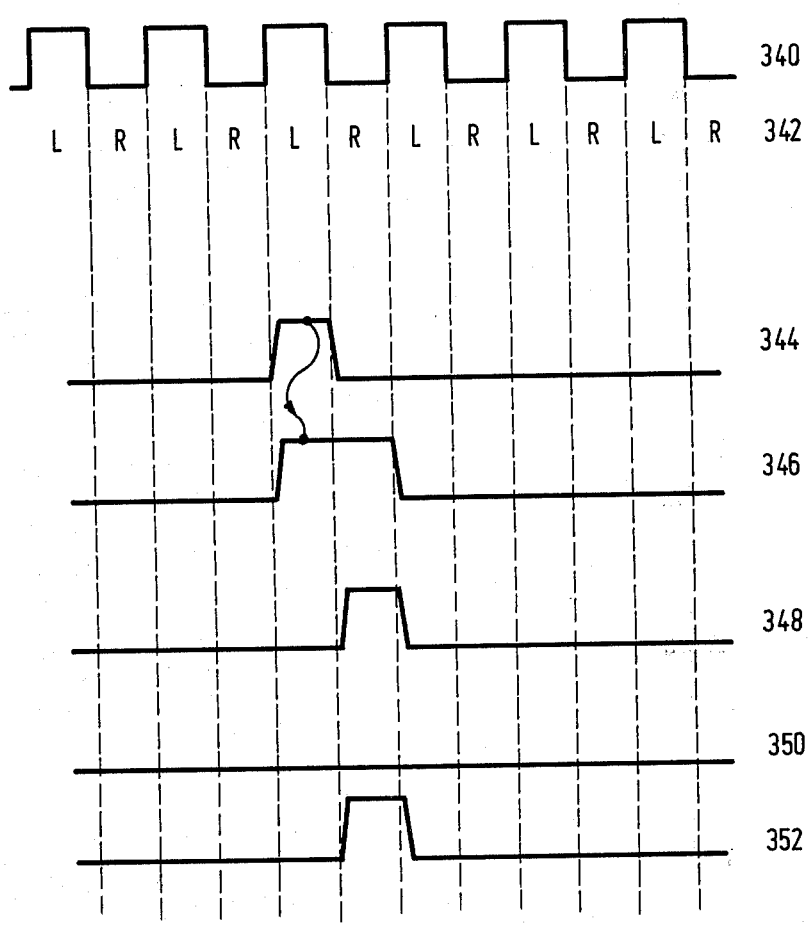
FIG. 10 gives a timing diagram of signals for the case of FIG. 9.

In this connection FIG. 10 gives an explanatory clock-pulse diagram. Line 340 gives the clock-pulse signal, synchronous with the bit stream, from a clock not shown further for brevity. The trigger circuit is activated each time by the rising edges of the pulses. Line 342 gives the state of switch 322. L indicates that the switches in FIG. 11 (see figure) are in the lower state and that the switch 322 in FIG. 9 is in the lower state. Then the aforementioned word W is therefore added to the operative address. R of course means the opposite of L: in both figures the switches are in the upper position, and the word W is not added to the operative address. Line 344 gives the output signal from the read-only memory 306 for signalizing a disturbed parity bit. This occurs of course if the switch in FIG. 9 is in the lower state. This information is also stored according to line 346 in the trigger circuit 326. In the following half-period of the clock signal the output of the read-only memory becomes "0" again, at least if there was no information error. In any case the OR gate 328 delivers a logic "1" during a complete clock-pulse period, with AND gate 322 blocked and the residue signal taking the value "0". Line 348 gives the result when there is an information error but no parity error: the read-only memory then delivers, only in the second half of a clock-pulse period, a logic "1" which is not stored in the trigger circuit (line 350 gives the output signal thereof). Line 352 gives the output signal of OR gate 328. In the first half of a clock-pulse period AND gate 332 is therefore open so as to deliver a secondary syndrome signal as output signal. Since however the entire system is synchronously operating, only the signals operative in the second half of the clock-pulse cycle are shifted through to the following shift-register stage. In this case AND gate 322 is therefore also blocked at the relevant point in time.

Figure 11:
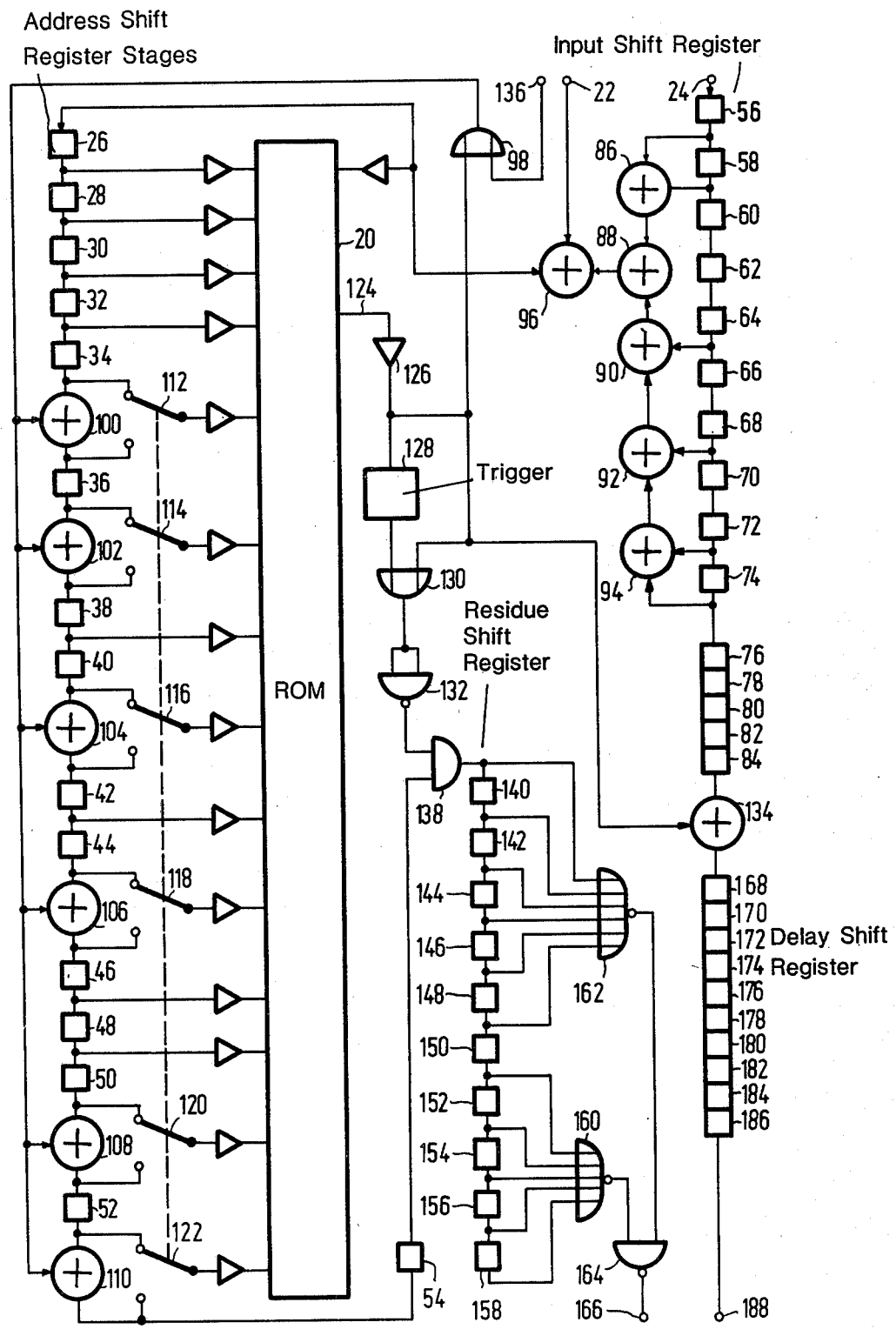
FIG. 11 gives a further apparatus according to the invention.

In this connection FIG. 11 gives a feedback decoder for $k = n - k = 1$ with three correctable 2-tuples in a segment of $u + 1 = 16$ two-tuples. The fig. only shows limited changes with respect to FIG. 4. The input shift-register comprises fifteen stages 56 to 84 inclusive. The code is indicated in FIG. 3 as fifth from the left. This code therefore has a small encoding constraint length. The parity is determined by the five EXCLUSIVE-OR elements 86 to 94 inclusive. This therefore takes place again without the participation of the $D^0$ in the relevant polynominal. Terminal 22 receives the parity bits and EXCLUSIVE-OR element 96 therefore gives the syndrome sequence. This is supplied to the address register of read-only memory which is built up from fifteen shift-register stages 26 to 54 inclusive and six EXCLUSIVE-OR elements 100 to 110 inclusive. The read-only memory therefore has a capacity of $32 \, k \times 1$. The switches 112 to 122 inclusive are operated together by the clock-pulse via a connection not shown. The provision of the aforementioned word W takes place because the EXCLUSIVE-OR elements are supplied with the clock-pulse from terminal 136 via OR gate 98. The addressing of read-only memory 20 takes place by means of unnumbered buffer elements, designated by small triangles, which introduce little delay with respect to the length of a clock-pulse period. They are not essential to the operation of the apparatus. Element 126 is also such a buffer element. The trigger circuit 128, OR gate 130, inverter 132 and AND gate 138 have been discussed in the case of FIG. 9. There is a delay shift register for the corrected information having ten shift register stages 168 to 186 inclusive. There is a shift register for the residue signal having ten stages 140 to 158 inclusive. The two NOR gates 160, 162 with the NAND gate 164 correspond to the OR gate 264 in FIG. 4. In this way the unreliability signal appears at terminal 166 together with the delayed information after the correction thereof (at terminal 188). In this case the two shift registers at the output have the length of ten stages. These lengths do not in principle need to be the same. They are both shorter than the decoding constraint length. The contents of the read-only memory are determined in a similar manner to those of read-only memory 250 in FIG. 4, as has been described with the aid of FIGS. 6, 7. It is thus always assumed that a disturbed n-tuple is the first of a segment in which only correctable n-tuples occur. In FIG. 6 this provided $1 + 8 + 8 = 17$ address lines, a number of which did not need to be implemented. In this case the number of possibilities is much larger: there can be 1, 2 or 3 disturbed n-tuples, while there are always three possibilities for the disturbance. Moreover the place can always differ. It is true that many addresses coincide, but even after reduction there remain many more than $10^3$ address lines which for brevity will not be discussed further here.

Figure 12:
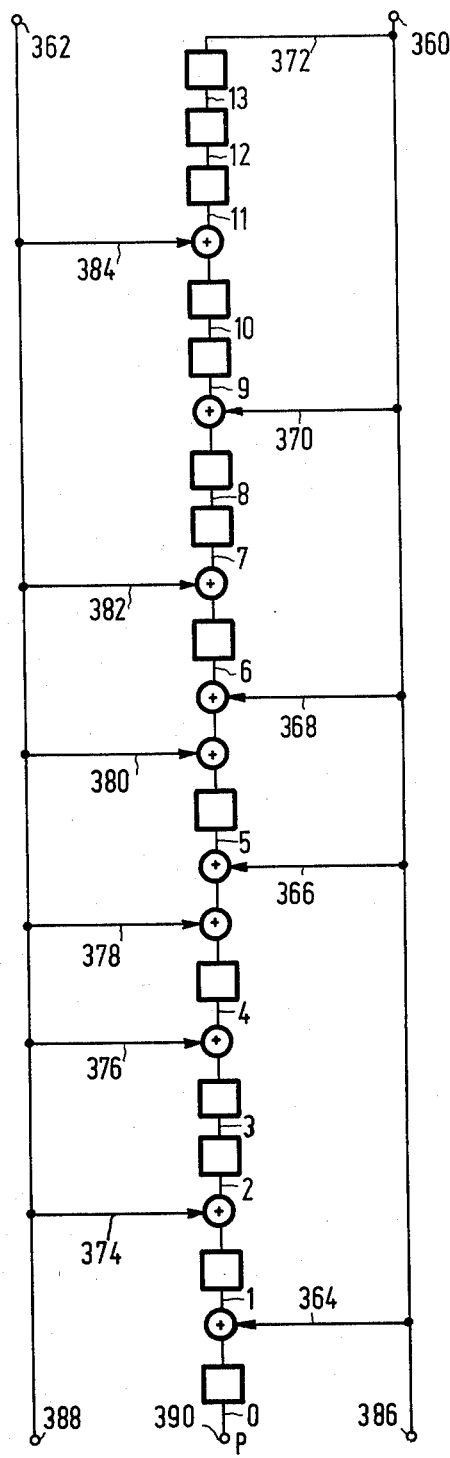
FIG. 12 gives an encoder for k=2 and n=3.

FIG. 12 gives an encoder circuit for a systematic convolutional code having $k = 2$ and $n = 3$. The information arrives at terminals 360, 362. The basic elements of the circuit are shown in the conventional manner. For the first information stream the generator polynominals contain the following terms in the delay polynominals contain the following terms in the delay operator D: $D^1$ (branch 364), $D^5$ (branch 366), $D^6$ (branch 368), $D^9$ (branch 370), $D^{14}$ (branch 372). For the second information stream the generator polynominal contains the terms in D: $D^2$ (branch 374), $D^4$ (branch 376), $D^5$ (branch 378), $D^6$ (branch 380), $D^7$ (branch 382), $D^{11}$ (branch 384). The encoding constraint length therefore has the value p=14 here. The decoding constraint length therefore has the value u=14 here. The parity bits appear at the output 390; the formation-containing k-tuples at the outputs 386, 388. It is found that with the code which is implemented in FIG. 12 two disturbed n-tuples in a segment of u+1=15 n-tuples can be corrected. This has been proved by determination of the minimum weight of the set of of initial sequences with the aid of a computer.

Figure 13:
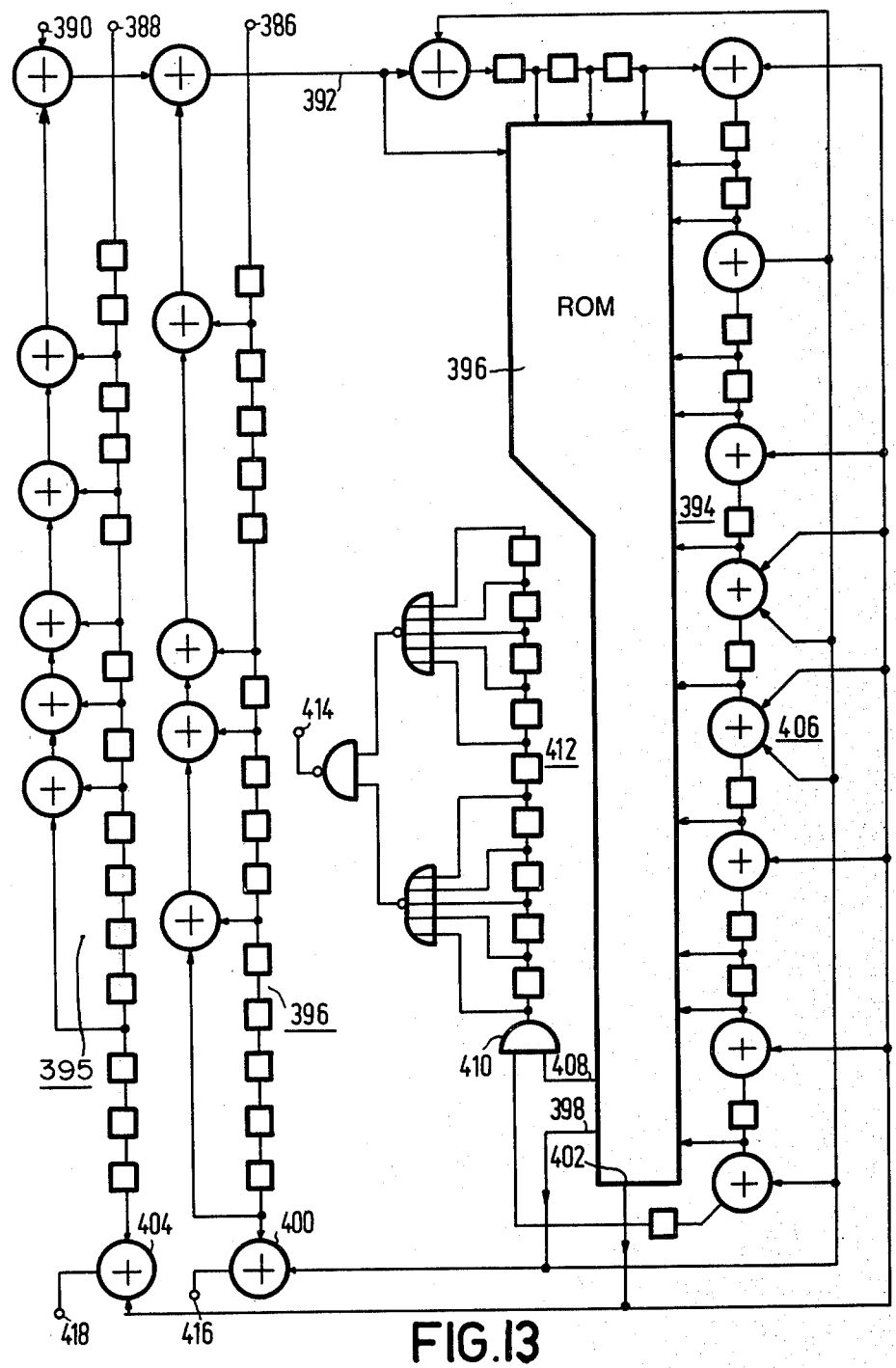
FIG. 13 gives in addition a third apparatus according to the invention.

FIG. 13 gives a feedback decoder for the code generated with the circuit of FIG. 12. The circuit is for the greater part of similar construction to the one in FIG. 11. The information bits arrive at the terminals 386, 388 which are connected to the corresponding output terminals in FIG. 12. The parity bits appear at the terminal 390 which corresponds to terminal 390 in FIG. 12. The information bits are supplied to 14-bit shift registers 394, 395. From these the parity bits are reconstructed and from these again the syndrome bits on line 392. The latter are supplied to an address register of 13 bits (+1 post-connected shift-register stage) 394, in which EX-CLUSIVE-OR elements are again included as updating devices. The read-only memory 396 is similarly organized to the read-only memory 250 in FIG. 4 but now has three outputs. The first output 398 leads to EX-CLUSIVE-OR element 400 so as to update the first information stream. The second output 402 leads to EXCLUSIVE-OR element 404 so as to update the second information stream. Both outputs 398, 402 lead to the address register 394 so as to compensate the syndrome sequence for the changes in the information streams. Here element 406 for example operates upon three input signals (one syndrome signal and two correction bits) and thus works as a molulo-2 adder for three bits. The third output 408 of read-only memory 396 leads to AND gate 410 so as to generate the residue signal. This is stored in a 9-bit shift register 412. The unreliability signal then appears via NOR and NAND gates at terminal 414. At the outputs 416, 418 of EX-CLUSIVE-OR elements 400, 404 further shift registers can be connected (see elements 168–186 in FIG. 11, or 266–274 in FIG. 4) so as to delay the information by a time that at the maximum corresponds to the detection delay of the unreliability signal at terminal 414. The latter shift registers are not drawn here.

Figure 14A:
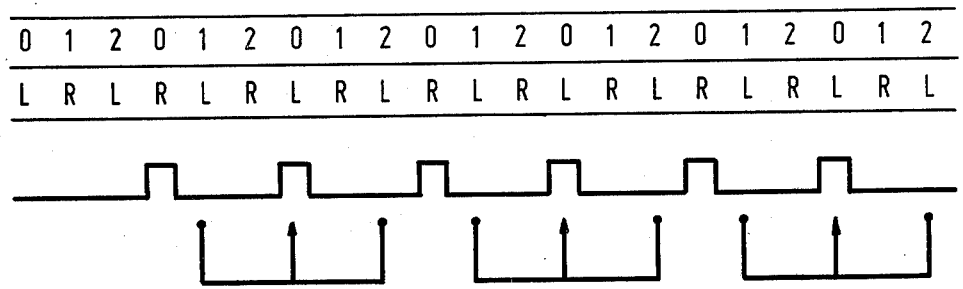
FIGS. 14a, 14b give a mode of operation for the execution of a correction in the case of an interleaved organization of the n-tuples of code elements.
Figure 14B:
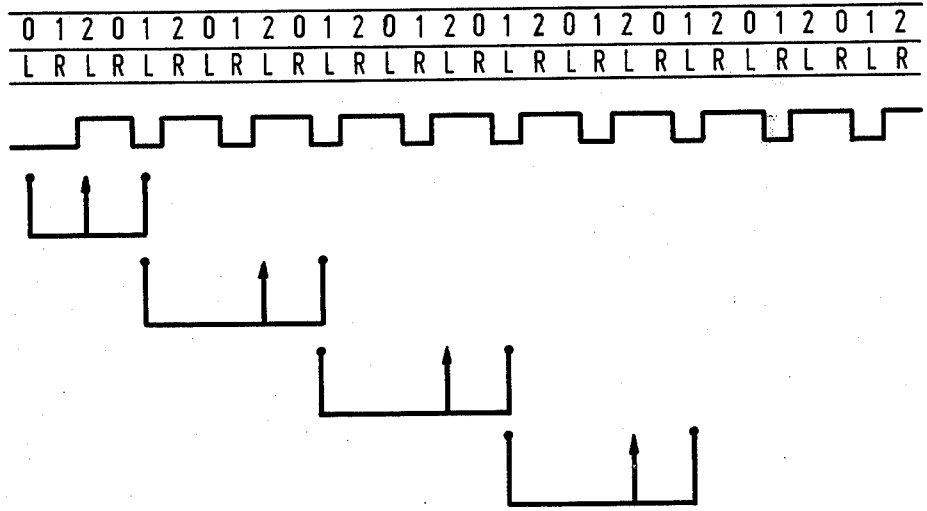

The practical application of the foregoing can be further increased by replacing in both encoder and decoder each shift register stage (the small squares in the figure) by a shift register having always the same number of stages. This is in particular advantageous in the case of burst errors. If the aforementioned elementary shift registers are each three bits long the n-tuples of code elements are divided into three classes. The rank numbers of the n-tuples of the respective classes can be written for example as: 3k, 3k+1, 3k+2, with k variable. In this case a burst of nine successive disturbed n-tuples in the apparatus according to FIG. 11 is still a priori correctable. In connection therewith an advantageous correction method for uncorrectable errors that have indeed been detected is: interpolation between the adjacent, correct, or correctly corrected signal values. These will usually belong to another class of signals because of the previously described interleaving of the information streams. An example is given in FIG. 14. This example relates to an audio signal with stereo recording/reproduction. For quadrophony the organization is in keeping. The recorded analogue information is recorded in a known manner and converted into a 14-bit binary code by means of an A/D converter. The 14-bit code is divided into two-tuples and by means of an encoder according to FIG. 12 a convolutional code having n=2 and k=3 is formed therefrom. At the receiving side the information bits are recovered and corrected, where necessary and possible, according to FIG. 13. The aforementioned unreliability signal activates an in itself known digital linear interpolator which performs an interpolation of adjacent signal values (from the same channel) over a value range of 9 bits. The corrected codes, or the interpolation values respectively, are again supplied to a D/A converter and acoustic reproduction apparatuses. The basic elements of the acoustic channels are completely known and will not be discussed here further. FIG. 14a gives a first interpolation method. There are three classes of signals 0, 1 and 2 in the interleaving organization. There are further two acoustically separate signals, left (L) and right (R). The third line gives the unreliability signal which indicates that the class "0" is disturbed. The interpolation now takes place between the adjacent signals having the same acoustic origin, as indicated at the fourth line, the interpolation is therefore according to:

$$L(m) = \tfrac{1}{2}\{L(m-1) + L(m+1)\}$$

when m is the moving time coordinate. The interpolation for the signal R takes place in each case in the same manner. It is therefore necessary in this case that both the other classes of signals provide reconstructable k-tuples of code elements. This restriction has been removed in FIG. 14b: there only the class "1" is reliable. Again only the interpolation for the signal "L" has been shown and then just for one class of the "L" signals, namely L (3m+2) which thus belongs to the class "2". The interpolation now takes place according to the formula:

$$L(m) = \tfrac{1}{3}\{2L(m+1) + L(m-2)\}$$

The interpolation for the "L" signals which belong to the class "0" takes place according to the formula:

$$L(m) = \tfrac{1}{3}\{2L(m-1) + L(m+1)\}$$

The signals of the class "1" are correctly L (m). The signals "R" are recovered in a corresponding manner. Interpolation with for example quadratic formulae is also possible hereafter, and likewise the subdivision of the signals into more classes.

What is claimed is:

1. Apparatus for the reception of a stream of binary code elements which form a sequence of n-tuples of an (n, k, p, u) error-correcting convolutional code, wherein k/n is the coding efficiency, p is the encoding constraint length, and u>p is the decoding constraint length, which apparatus comprises:

first-syndrome forming means (220, 222, 224, 226) for forming a sequence of (n−k)-tuples of syndrome elements in synchronism with the reception of n-tuples of code elements;

a logic unit (250) having first storage means (228–241) for storing a progressing sequence of u (n−k)-tuples of syndrome elements, and for forming, in synchronism with the reception of the n-tuples of code elements, a further sequence of j-tuples of correction elements (f1) at a first output, wherein j=k for a systematic code and j=n for a non-systematic code;

a correction apparatus (250) having second storage means (206-218) for storing at least the information containing part of the sequence of n-tuples of code elements during a time corresponding to at least u bit cells and for bitwise adding this thereafter modulo-2 to the corresponding j-tuple of correction elements;

a feedback connection (242-248) for supplying said sequence of j-tuples of correction elements to said logic unit for updating the (n−k)-tuples of syndrome elements stored therein so as to compensate these for the effects of the correction executed on said sequence of n-tuples of code elements;

modified-syndrome (252) forming means for forming at a second output, after the correction by means of said j-tuple of correction elements, an element of a sequence composed of (n−k)-tuples of modified-syndrome elements formed as based on the corrected sequence of n-tuples of code elements, where a first signal value of an (n−k)-tuple of modified syndrome elements indicates that a correct correction can have taken place, but all other values thereof that no correct connection can have taken place;

signalling means (254-264) connected to said second output for, upon receiving a predetermined amount of said other values, generating an unreliability signal;

characterized in that said first storage means constitute an address register to a read-only memory (250) having a plurality of separately addressable word locations and being contained in said logic unit, in that said modified-syndrome forming means comprise at least part of said read-only means co-addressable by outputs from said first storage means, and in that said signalling means comprise third storage means for storing a further sequence of said modified-syndrome (n−k)-tuples, and OR-ing means (264) for OR-ing a predetermined number of said other signal values for thereby producing said unreliability signal.

2. An apparatus as claimed in claim 1, for use with a code having n=2 and k=1, characterized in that the parity bit stream is generated by taking into account the data stream bits according to any one element of the following list, wherein the generator polynominal is represented by the relevant coefficients in the delay operator D having respective weights according to a series of powers of 2 and in decimal representation thereof:

for a minimum distance of 4 (u=5): 38, 58 for a minimum distance of 5 (u=8): 58, 166, 250, 294, 358, 378 for a minimum distance of 6 (u=11): 1,702, 2,618, 3,430, 3,834 for a minimum distance of 7 (u=15): 1702, 5,952, 16,122, 19,814, 24,314, 48,486, 55,866, 59,046, 60,774, 64,058.

3. An apparatus as claimed in claim 2, wherein also the data bit term $D^0$ is taken into account for producing a redundancy bit.

4. Apparatus as claimed in claim 1, in which for a digital audio signal composed of f bits the k most significant thereof are always processed as a said k-tuple of information elements and the f-k are processed without error-correcting convolutional code.

5. Apparatus as claimed in claim 1, in which means of interleaving are provided for processing the terms of all sequences of signals cyclically modulo the interleaving factor built into the means of interleaving.

6. Apparatus as claimed in claim 1, which is suitable for processing digital audio signals divided among at least two sound channels.

* * * * *